United States Patent [19]

Brust et al.

[11] Patent Number: 4,689,555
[45] Date of Patent: Aug. 25, 1987

[54] METHOD FOR THE DETERMINATION OF POINTS ON A SPECIMEN CARRYING A SPECIFIC SIGNAL FREQUENCY BY USE OF A SCANNING MICROSCOPE

[75] Inventors: Hans-Detlef Brust, Dudweiler; Johann Otto, Bad Toelz, both of Fed. Rep. of Germany

[73] Assignee: Siemens Aktiengesellschaft, Berlin and Munich, Fed. Rep. of Germany

[21] Appl. No.: 837,813

[22] Filed: Mar. 10, 1986

[30] Foreign Application Priority Data

Mar. 22, 1985 [DE] Fed. Rep. of Germany ....... 3510494

[51] Int. Cl.⁴ .......................................... G01R 31/26
[52] U.S. Cl. ................................................ 324/158 R
[58] Field of Search ............... 324/71.3, 158 R, 73 R; 250/310, 311, 492.2

[56] References Cited

U.S. PATENT DOCUMENTS

| | | | |
|---|---|---|---|
| 4,169,229 | 9/1979 | Feuerbaum | 250/396 R |
| 4,223,220 | 9/1980 | Feuerbaum | 250/310 |
| 4,277,679 | 7/1981 | Feuerbaum | 250/310 |

FOREIGN PATENT DOCUMENTS 2553705 3/1977 Fed. Rep. of Germany .

OTHER PUBLICATIONS

Scanning Electron Microscopy/1970, Proc. of the Third Annual S.E.M. Symp., "Time Varying Potential Difference Observations with the SEM", Gaffney, Apr. 1970, pp. 433–440.
"Scanned Electron-Beam Probe Shows Surface Acoustic Waves in Action", by Hans-Peter Feuerbaum et al., Electronics, May 19, 1983, pp. 132–136.
Proc. of Journal d'Electronique, 1983, J. P. Collin—pp. 283–299, "An Economical Alternative for Stroboscopic Voltage Contrast . . . ".

Primary Examiner—Reinhard J. Eisenzopf
Assistant Examiner—Stephen M. Baker
Attorney, Agent, or Firm—Hill, Van Santen, Steadman & Simpson

[57] ABSTRACT

A method and apparatus for determination of specific points on a specimen carrying a signal having a specific signal frequency by use of a scanning microscope. A detector provides a secondary electrical signal corresponding to respective particular scan points. An output of the detector connects to first and second evaluation circuits which each output a signal based on and representative of the specific signal frequency. The first evaluation circuit has a band-width substantially narrower than the second evaluation circuit. An output signal of the second evaluation circuit determines when to switch a scanning generator of the scanning microscope from a first scan rate to a second slower scan rate. The output signal of the first evaluation circuit is employed for evaluation relative to the specific points carrying the specific signal frequency.

35 Claims, 4 Drawing Figures

METHOD FOR THE DETERMINATION OF POINTS ON A SPECIMEN CARRYING A SPECIFIC SIGNAL FREQUENCY BY USE OF A SCANNING MICROSCOPE

BACKGROUND OF THE INVENTION

The invention relates to a method for the determination of those points on a specimen which carry a specific signal frequency. A scanning microscope is employed for the purpose of scanning the specimen. The scan rate is defined by a scan generator and by a deflection device controlled by the scan generator. A secondary electrical signal is derived from the respective scanned point via a detector. This electrical signal is supplied to an evaluation circuit which selects and outputs a signal based on and representative of the specific signal frequency.

A method of this type has been proposed in German Patent Application No. P 34 20 272.2, incorporated herein by reference. A particle microscope is employed wherein a particle beam, for example an electron beam, successively scans a group of points on a specimen as a primary beam. The particle beam is pulsed with a variable pulse frequency which deviates from the specific signal frequency by an amount equal to a fixed frequency. A first evaluation circuit is formed of a band-pass filter having a narrow pass-band whose center frequency corresponds to the fixed frequency and of a following demodulator.

A further method of this type is known from Proc. of Journee d'Electronique, 1983 "Testing Complex Integrated Circuits: A Challenge", published by the Swiss Federal Institute of Technology, Lausanne, Switzerland, pages 283 through 298, incorporated herein by reference. The detection of a specific signal frequency at the points of an integrated circuit is executed herein by use of a scanning electron microscope and of a "lock-in amplifier" serving as a first evaluation circuit. A signal having the desired signal frequency is filtered out from a potential contrast signal acquired at a point. It is filtered out with the assistance of the "lock-in" amplifier. The intensity of this signal is then displayed on the picture tube of the microscope as an intensity fluctuation.

Given the methods cited above, the maximum speed with which a group of points can be successively scanned on the specimen is limited by the band width of the first evaluation circuit. This band width must be as great as possible for a fast measurement. This likewise is desirable in view of the lowest possible load on the specimen due to the electron beam. However, the sensitivity of the method decreases with increasing band width, since the signal-to-noise ratio of the output signal of the first evaluation circuit deteriorates. In order to achieve a short measuring time, therefore, a reduction of the sensitivity or of the spatial resolution of the scanned points on the specimen must be accepted.

SUMMARY OF THE INVENTION

An object of the invention is to bring about a reduction of the measuring time required for scanning the specimen surface or a part thereof without deterioration of the spatial resolution and sensitivity. This is achieved in accordance with the invention by providing a first evaluation circuit tuned to the specific signal frequency which is designed to have a relatively narrow band-width. A second evaluation circuit is provided tuned to the specific signal frequency and which has a relatively broader band-width. An output signal of the second evaluation circuit with the broader band pass characteristic is employed as a basis for determining when to switch the scan generator from a first to a slower, second scan rate.

The advantage obtainable with the invention is that only those parts, for example interconnections, of the specimen surface which carry the desired signal frequency are scanned with a relatively low speed, and thus with high sensitivity and spatial resolution. The remaining parts are scanned with increased speed. The measuring time is thus substantially reduced without the spatial resolution or the sensitivity of the method being diminished.

DESCRIPTION OF THE PREFERRED EMBODIMENTS

Figure 1:
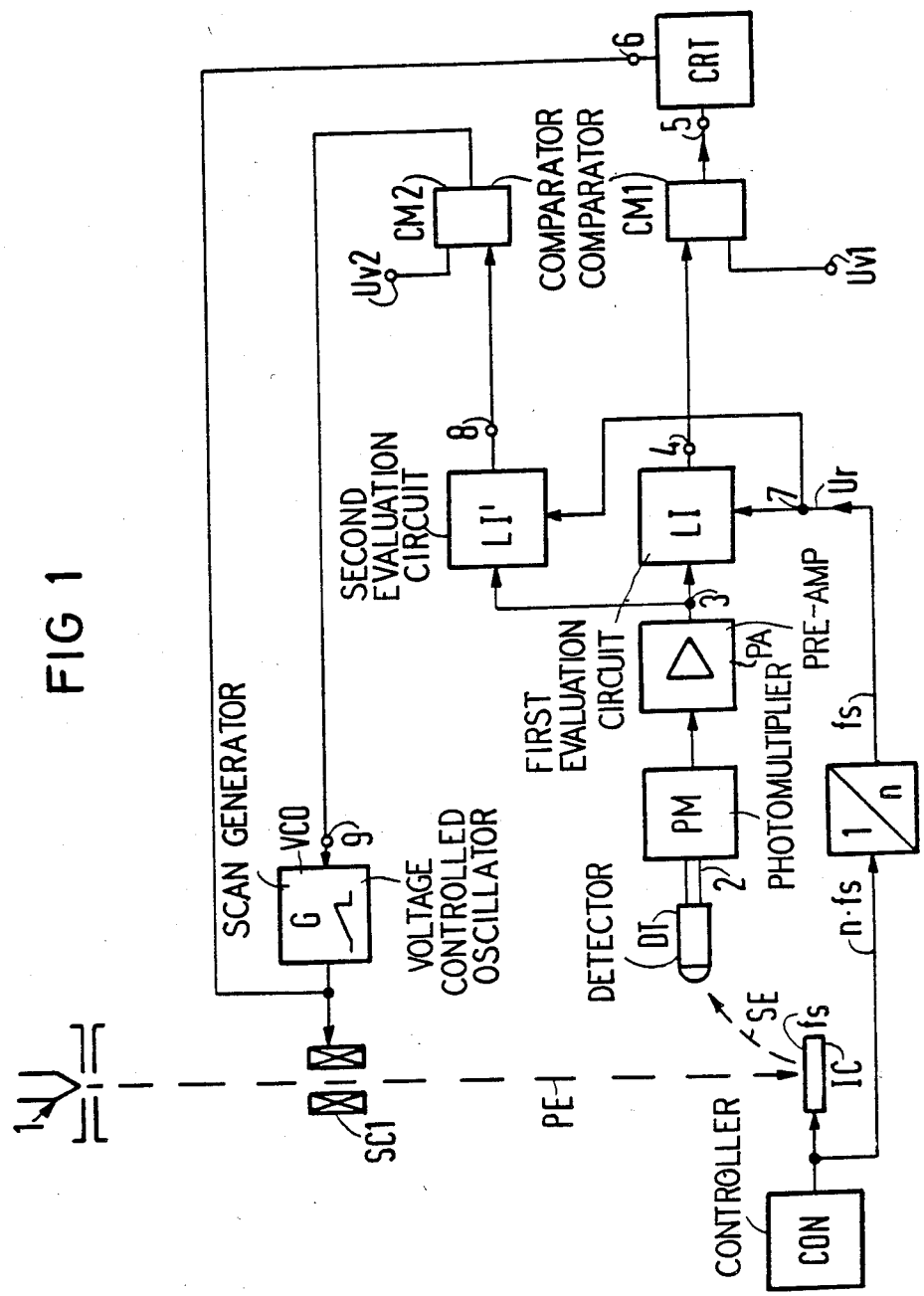
FIG. 1 illustrates a first arrangement for the implementation of the method of the invention.

In the arrangement of FIG. 1, the electrons emerging from an electron source 1 of a scanning electron microscope form a primary beam PE. This beam impinges points on a specimen IC, for example a point of an integrated circuit to be investigated, and triggers secondary electrons SE there. These are documented in a detector DT. Dependent on the secondary electron current which impinges the detector DT, light pulses are generated in this detector DT, these light pulses being supplied to a photomultiplier PM via a light guide 2 for the emission of a secondary electrical signal. After an amplification in a preamplifier PA, the secondary electrical signal is supplied to the input 3 of a first evaluation circuit LI which is fashioned as a "lock-in" amplifier. The output signal of LI appearing at 4 proceeds to a comparator CM1 which is connected to a variable comparison voltage Uv1. When the output signal LI exceeds the value of Uv1, then it is applied from the output of the comparator CM1 to the intensity control input 5 of a picture tube CRT. The electron beam of the picture tube is positioned in association with horizontal and vertical deflection devices which are controlled via an input 6 by the deflection voltages generated by a scan generator G. Since the scan generator G also controls the deflection systems (referenced SC1) for the primary beam PE with these deflection voltages, a deflection PE across a group of points on the specimen IC occurs which corresponds to the deflection of the electron beam across the picture screen CRT over a group of allocated picture elements.

The integrated circuit IC is controlled with a signal having the frequency $n \times fs$ from a controller CON. Via a frequency divider which divides $n \times fs$ to a frequency $fs$, this signal is additionally supplied to the first evaluation circuit LI as a reference voltage Ur via its input 7. The first evaluation circuit LI, which is a narrow-band circuit, is tuned to the frequency $fs$ by this reference voltage Ur. When the point scanned by PE then carries a signal having the signal frequency $fs$, the secondary electrical signal derived via DT and PM at the input 3 of LI also contains a signal component having the frequency fs. LI selects and demodulates this signal component, and the output signal of LI controls the intensity of the electron beam of the picture tube CRT.

A second evaluation circuit LI' is also provided in FIG. 1, this being fashioned in accordance with the evaluation circuit LI but being substantially more broad-banded than the first circuit.

The input of LI' is at the circuit point 3 and is thus connected parallel to the evaluation circuit LI at the input side. This also refers to the reference signal input of LI' which is connected to the circuit point 7. The output signal appearing at the output 8 of LI' proceeds to a comparator CM2 which is connected to a variable comparison voltage Uv2. When the output signal LI' exceeds the value of Uv2, then it is connected to a control input 9 of the scan generator G.

In accordance with the method of the invention, the primary beam PE scans a group of points on the specimen IC with a first scan rate corresponding to the drive of the deflection systems SC by the scan generator G. These points can, for example, lie on a line or on a plurality of parallel lines which cover the entire specimen surface. When the point respectively scanned carries a signal having the frequency fs, then an output signal arises at the output 8 of the broad-band evaluation circuit LI' which is tuned to fs via the reference voltage Ur. This output signal is connected to the control input 9 of the scan generator G when a threshold established by Uv2 is exceeded and switches the scan generator G from the first scan rate to a lower, second scan rate. An output signal which is acquired at the lower, second scan rate is thus obtained at the output 4 of LI. In the illustrated example, this is employed for intensity modulation of the picture tube CRT, so that the points carrying the signal frequency fs are emphasized on the picture screen CRT by their brightness.

The second evaluation circuit LI' only serves the purpose of identifying when a signal having the signal frequency fs is detected on the specimen IC and, given appearance of such a signal, of initiating the switch-over of G to the lower, second scan rate. As a result thereof, the first scan rate can be selected sufficiently high such that the uninteresting regions on the specimen IC which do not carry the desired signal having the signal frequency fs are rapidly scanned. This high scan rate, which would not allow an exact identification of the signal-carrying points with satisfactory spatial resolution and sensitivity, is replaced by a slow scan rate necessary for the exact determination of these points when the interesting regions on the specimen in which the signal-carrying points which are sought are located and reached. After departing from the interesting regions, the output signal of LI' has then also disappeared, so that the scan generator G is switched back to the first, higher scan rate. The interesting signal frequency range can be systematically searched by varying the frequency of the reference signal Ur.

In accordance with another development of the arrangement of FIG. 1, the first evaluation circuit LI can be variable in band width. It thus first operates in a broad-band operating mode, whereby the scan generator G is set to a first scan rate. During the appearance of an output signal at the output 4 or 5, an input of LI is then driven, and a switch-over of the evaluation circuit into its narrow-band operating mode is undertaken via this input. Simultaneously, the output 4 or 5 is then also connected to the input 9 of G, so that G is switched by the output signal at 4 or 5 to the lower, second scan rate. The switch-over of the scan rate can thus occur both in discrete steps as well as continuously. The further evaluation of the output signal LI occurs in the fashion already set forth.

The "lock-in" amplifiers LI and LI' are known in and of themselves and can, for example, be formed of Ithako amplifiers of the type 391A. For example, LI can have a band width of 100 Hz and LI' can have a band width of 1 kHz. The scanning electron microscope can, for example, be formed of the ETEC Autoscan II. An apparatus of this type is disclosed, for example, in U.S. Pat. No. 4,277,679, incorporated herein by reference.

Figure 2:
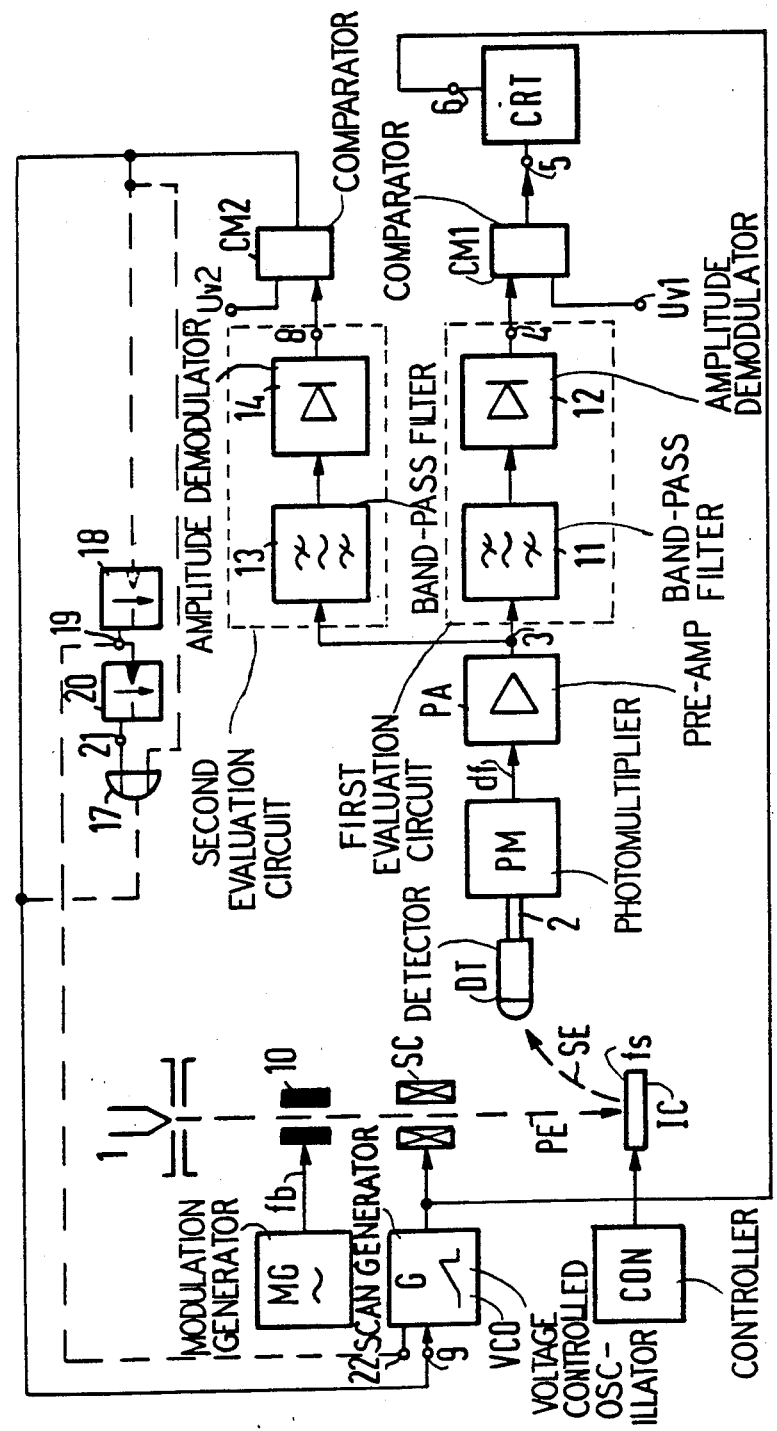
FIG. 2 shows a second arrangement for the implementation of the method of the invention.

FIG. 2 shows another circuit arrangement which is suitable for the implementation of the method of the invention. A scanning electron microscope as disclosed, for example, in U.S. Pat. No. 4,223,220, incorporated herein by reference, can be employed therein. Those circuit parts already described with reference to FIG. 1 are provided with the same reference characters in FIG. 2. Differing from FIG. 1, the primary beam PE is modulated in intensity by means of a modulation system 10. A suitable modulation system is disclosed, for example, in U.S. Pat. No. 4,169,229, incorporated herein by reference. It is driven by a modulation generator MG with a modulation frequency fb which is offset by an amount df relative to the specific signal frequency fs which a point being searched for on the specimen IC should have. A signal having the signal frequency fs which has been encountered on the specimen mixes with the frequency fb with which the primary beam PE is intensity-modulated to form an intermediate frequency signal of the fixed frequency df. The secondary electrical signal which is adjacent to circuit point 3 thus comprises a signal component having the fixed frequency df. The first evaluation circuit herein is formed of a narrow-band band-pass filter 11 and an amplitude demodulator 12 following thereupon. The second evaluation circuit is formed of a broad-band band-pass filter 13 and of a following amplitude demodulator 14. Both band-pass filters 11 and 13 are tuned to the frequency df. The signal component transmitted by the band-pass filter 11 to the output 4 is demodulated in the amplitude demodulator 12, whereby every signal exceeding Uv1 effects an intensity modulation of the respective picture element on the picture tube CRT. On the other hand, the secondary electrical signal is also selected via the broad-band band-pass filter 13, is demodulated in the amplitude demodulator 14, and effects an output signal at the output 8 which is supplied to the control input 9 of G when a voltage threstold Uv2 is exceeded. This serves for switching the scan generator G from a first, relatively high scan rate to a lower, second scan rate.

Figure 3:
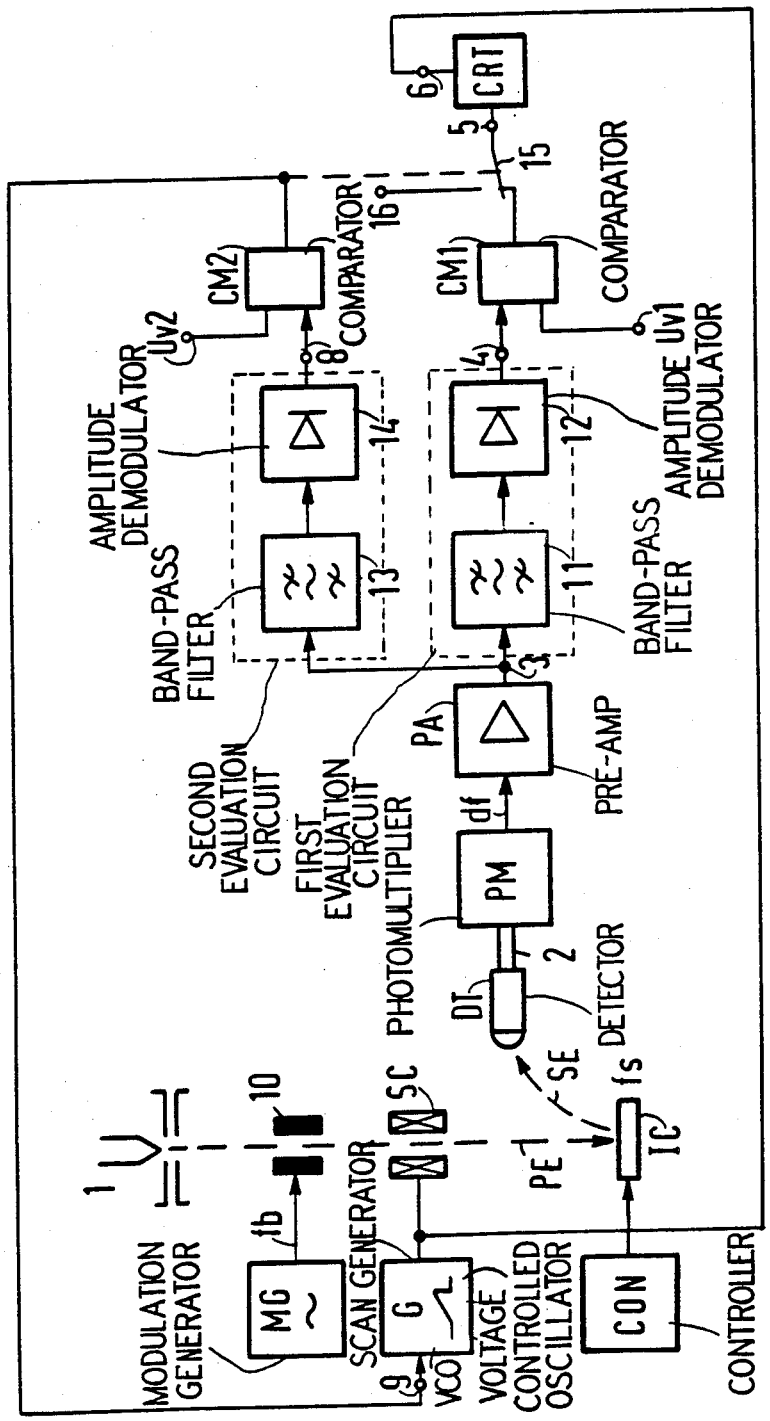
FIG. 3 ,is a further development of the arrangement of FIG. 2 which is also of significance for FIG. 1.

FIG. 3 shows a development of the arrangement of FIG. 2 wherein the signal at the output 4 of the first evaluation circuit 11, 12 is supplied to the intensity control input 5 of the picture tube CRT in the indicated position of a switch-over means 15, as previously described. In this switch position, however, 15 is only held during the appearance of an output signal at the output 8 of the second evaluation circuit 13, 14. When no output signal appears at 8, then a signal at the terminal 16 is supplied to the input 5. This can, for example, be the output signal of the broad-band evaluation circuit 13, 14, or can be a topography signal derived from the secondary electrical signal, this topography signal being, in particular, supplied in attenuated form. How such a topography signal is acquired can be derived, for example, from the book by L. Reimer and G. Pfefferkorn, Raster-Elektronenmikroskopie (Springer Verlag, Berlin, Second Edition, 1977), pages 1–3 and 109–130, incorporated herein by reference.

The development of the arrangement of FIG. 2 set forth above can also be utilized, given the arrangement of FIG. 1.

In accordance with another, preferred development of the arrangement of FIG. 2, the output 8 of the second evaluation circuit 14 can also be connected to the first input of an OR gate 17 whose output is then connected to the control input 9 of scan generator G. In this case, the output 8 is also wired to the clock input of a monoflop 18 whose output 19 is connected to the clock input of a second monoflop 20. The output 21 thereof lies at a second input of the OR gate 17. The output 19, finally, is connected to a second control input 22 of scan generator G via which the scan direction when scanning the points on the specimen IC can be reversed. As soon as an output signal of the broad band evaluation circuit 13, 14 is received, the monoflop 18 triggers and supplies a signal via output 19 which effects a reverse of the scan direction of the primary beam PE at the input 22, and likewise effects a reverse of the running direction of the electron beam of the picture tube CRT. The length of the signal emitted by monoflop 18 thus determines the degree of flyback resulting for the primary beam PE and for the electron beam of the CRT. This flyback is preferably undertaken with the high scan rate. After conclusion of the flyback, PE and the electron beam CRT are again deflected in a forward direction, whereby the monoflop 20 triggered by the trailing edge of the signal emitted by 19 emits a signal within its time element via 21, this signal being supplied to the control input 9 and causing a slow scan rate even when, due to the flyback, an output signal is no longer present at the output 8. What can be avoided by means of this development is that, when the primary beam PE reaches those parts of the specimen IC in which the signal frequency fs is carried, the primary beam PE — as a consequence of its relatively high scanning speed — only reproduces the limits of these parts imprecisely in the presentation on the picture screen of the CRT. This arrangement can also be combined with an arrangement having only one evaluation circuit as well as with the arrangement of FIG. 1 (likewise having only one evaluation circuit under given conditions).

The second evaluation circuit 13, 14 can also be omitted in the arrangement of FIG. 2 or FIG. 3 when the bandwidth of the first evaluation circuit 11, 12 is variable. In this case, the evaluation circuit 11, 12 first operates in a broad-band operating mode, whereby G is set to a first, relatively high scan rate. During the appearance of an output signal at the output 4 or 5, a control input of the band-pass filter 11, 12 is then occupied with this signal, whereby a switching of 11, 12 into the narrow-band operating mode occurs. At the same time, the control input 9 of G is also occupied with this signal, so that G is switched to the lower, second scan rate. The switching of the band width and of the scan rate herein can again occur both in discrete steps as well as continuously.

In accordance with a preferred development of the method of the invention, the output signals of the second evaluation circuit LI' or 13, 14 received during a first, fast scan sequence can also be intermediately stored, for example in the memory of a computer. Thus a precise evaluation by the output signals of the first evaluation circuit is then undertaken with the assistance of the first, narrow-band evaluation circuit LI or 11, 12 in a second, slow scan sequence. This is undertaken in those regions in which output signals were received in the fast scan sequence.

Figure 4:
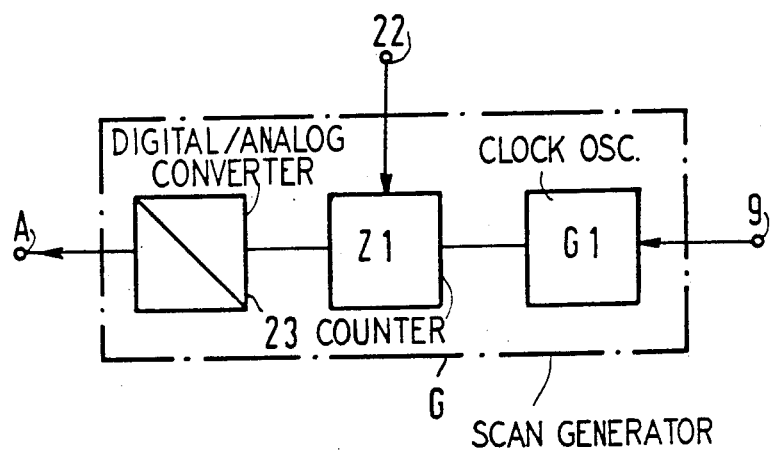
FIG. 4 i illustrates the scan generator G of the arrangement of FIGS. 1 through 3.

FIG. 4 shows a practical sub-circuit of the scan generator G. This is formed of a clock oscillator G1 whose clock frequency is influenced by a signal adjacent to the input 9. G1 can also be referred to a a VCO (voltage controlled oscillator). A following counter Z1 counts the clock pulses output G1, whereby an analog signal corresponding amplitude-wise to the respective counter reading is derived via a digital-to-analog converter 23. Given periodic resetting of Z1 to an initial value, this then represents a saw-tooth deflection voltage which is output via the output A. For the purpose of reversing the scan direction, the input 22 is supplied with a signal which reverses the counting direction of Z1. The scan generator G preferably comprises a respective circuit of the type shown in FIG. 4 for generating the horizontal deflection voltage and the vertical deflection voltage.

Departing from the arrangements shown in the drawing figures, other scanning microscopes can also be employed for scanning the specimen IC within the framework of the invention, such as, for example, a laser scanner or a SAM (scanning acoustic microscope).

In a modification of the arrangement of FIG. 1, the reference voltage having the frequency fs can also be acquired in some other fashion than that shown, such as from an output signal of the specimen IC. This is recommended given integrated circuits having an internal clock oscillator which no longer requires a drive.

Given the arrangements of FIGS. 2 and 3, the differential frequency df can also be selected as the difference between fs or a multiple of fs and fb, or a multiple of fb. In this case, the differential frequency df does not arise due to the mixing of the fundamental oscillations, but due to a mixing with at least one upper harmonic. This, for example, can be advantageous when the modulation system only comprises a greatly limited band width, and one would like to select higher-frequency signals fs.

The controller CON is not absolutely necessary given the arrangements of FIGS. 1 through 3, insofar as the specimen can also function without drive. A synchronization of the reference signal Ur and of the signal on the specimen is likewise not absolutely necessary.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for determination of specific points on a specimen carrying a signal having a specific signal frequency by use of a scanning microscope, comprising the steps of:
successively scanning witn a primary beam of the microscope a group of points on the specimen;
defining a scan rate for the primary beam with a scan generator;
deriving a secondary electical signal corresponding to the scanned group of points;
supplying said secondary electrical signal to a first evaluation circuit and also to a second evaluation circuit, each of the first and second evaluation circuits providing an output a signal based on and representative of the specific signal frequency;

providing the second evaluation circuit with a broad band-width substantially broader than a narrow band-width of the first evaluation circuit;

employing the output signal of the second evaluation circuit to determine when to switch the scan generator from a first scan rate to a second substantially slower second scan rate; and employing the output signal of the first evaluation circuit for evaluation with respect to the specific points carrying said specific signals frequency.

2. A method according to claim 1 wherein said secondary electrical signal is derived via a detector from a secondary particle current.

3. A method according to claim 1 wherein the output signal of said second evaluation circuit is first intermediately stored during a first scan sequence with respect to said group of points and is then employed during a second scan sequence with respect to this group for switching said scan generator from said first to said second slower scan rate.

4. A method for determination of specific points on a specimen carrying signal having a specific signal frequency by use of a scanning microscope, comprising the steps of:

successively scanning witn a primary beam of the microscope a group of points o the specimen;

defining a scan rate for the primary beam with a scan generator;

deriving a secondary electrical signal corresponding to the scanned group of points;

intensity modulating said primary beam with a selectable modulation frequency;

supplying said secondary electrical signal to a first evaluation circuit and also to a second evaluation circuit, each of the first and second evaluation circuits providing an output a signal based a difference between the respective modulation frequency or a multiple thereof and the specific signal frequency or a multiple thereof;

providing the second evaluation circuit with a broad band-width substantially broader than a narrow band-width of the first evaluation circuit;

employing the output signal of the second evaluation circuit to determine when to switch the scan generator from a first scan rate to a second substantially slower second scan rate; and employing the output signal of the first evaluation circuit for evaluation with respect to the specific points carrying said specific signal frequency.

5. A method according to claim 4 wherein said secondary electrical signal is derived via a detector from a secondary particle current.

6. A method according to claim 4 wherein the output signal of said second evaluation circuit is first intermediately stored during a first scan sequence with respect to said group of points and is then employed during a second scan sequence with respect to this group for switching said scan generator from said first to said second slower scan rate.

7. A method for determination of specific points on a specimen carrying a signal having a specific signal frequency by use of a scanning microscope, comprising the steps of:

successively scanning with a primary beam of the microscope a group of points on the specimen;

defining a scan rate for the primary beam with a scan generator;

deriving a secondary electrical signal corresponding to the scanned groups of points;

supplying said secondary electrical signal to an evaluation circuit which provides an output signal based on and representative of the specific signal frequency, and wherein said evalutaion circuit has bandwidth changeable between a broad-band operating mode and a narrow-band operating mode;

setting the scan generator to a first scan rate;

detecting when said output signal from said evaluation circuit exceeds a predetermined value with said evaluation circuit in the broad-band operating mode, switching the evaluation circuit to the narrow-band operating mode for at least a portion of a duration of the output signal exceeding the predetermined value, and switching the scan generator from the first to a slower second scan rate for at least said portion of the duration.

8. A method according to claim 7 wherein said secondary electrical signal is derived via a detector from a secondary particle current.

9. A method according to claim 7 including the step of first intermediately storing the output signal for the evaluation circuit during a first scan sequence with respect to said group of points and then employing the stored output signal during a second scan sequence of said group of points and at that time switching the scan generator to said second lower scan rate.

10. A method for determination of specific points on a specimen carrying a signal having a specific signal frequency by use of a scanning microscope, comprising the steps of:

successively scanning with primary beam of the microscope a group of points on the specimen;

defining a scan rate for the primary beam with a scan generator;

deriving a secondary electical signal corresponding to the scanned group of points;

intensity modulating said primary beam with a selectable modulation frequency;

supplying said secondary electrical signal to an evaluation circuit having a bandwidth changeable between a broad-band operating mode and a narrow-band operating mode, and said evaluation circuit providing an output signal based on and representative of a difference frequency between the modulation frequency or multiple thereof and the specific signal frequency or a multiple thereof;

setting the scan generator to a first scan rate;

detecting when said output signal from said evaluation circuit exceeds a predetermined value with said evaluation circuit in the broad-band operating mode, switching the evaluation circuit from broad-band operating mode to the narrow-band operating mode at least for a portion of a duration of the output signal exceeding the predetermined value, and switching the scan generator from the first to a slower second scan rate for at least said portion of the duration.

11. A method according to claim 10 wherein said secondary electrical signal is derived via a detector from a secondary particle current.

12. A method according to claim 10 including the step of intermediately storing the output signal from the evaluation circuit during a first scan sequence with respect to said group of points and then employing it during a second scan sequence of the group of points during which the scan generator is switched to the slower second scan rate.

13. A system for determination of specific points on a specimen carrying signal having a specific signal frequency, comprising:
    a scanning microscope having a primary beam;
    a scan generator means connected to the scanning microscope for defining the scan rate of and for controlling a deflection of the primary beam at the scanning rate;
    means for deriving a secondary electrical signal corresponding to the scanned specific points;
    an output of said means for deriving a secondary electrical signal connecting to a first evaluation circuit means and a second evaluation circuit means, each of the first and second evaluation circuit means provides an output signal based on and representative of the specific signal frequency;
    the second evaluation circuit means having a broad band-width substantially broader than a narrow band-wdith of the first evaluation circuit means;
    said scan generator means having a first scan rate and a second substantially slower scan rate;
    means for employing the output signal of the second evaluation circuit means to determine when to switch the scan generator means from the first scan rate to the second substantially slower scan rate; and
    means for employing the output signal of the first evaluation circuit means for evaluation with respect to the specific points carrying said specific signal frequency.

14. A system according to claim 13 wherein at least one of said first and second evaluation circuit means comprises a bandpass filter and a following demodulator.

15. A system according to claim 13 wherein the output of the second evaluation circuit means connects to a comparator and an output of the comparator connects to the scan generator means.

16. A system according to claim 13 wherein the first evaluation circuit means output connects to a comparator and an output of the comparator connects to a CRT.

17. A system according to claim 13 wherein at least one of said first and second evaluation circuit means comprises a lock-in amplifier tuned to the frequency supplied to it.

18. A system according to claim 13 wherein the first and second evaluation circuit means each connect to a respective following threshold circuit comprising a comparator and a respective comparison voltage supplied thereto.

19. A system according to claim 13 wherein said scan generator means supplies a position signal for defining a respective scanned point to a recording means together with the output signal of said first evaluation circuit means.

20. A system according to claim 13 wherein said scan generator means is connected to a deflection device for an electron beam of a picture tube system, and an intensity control input of the picture tube system is connected to the output of said first evaluation circuit means.

21. A system according to claim 20 wherein said intensity control input is connected via a switch-over means to the output of said first or said second evaluation circuit means.

22. A system according to claim 20 wherein said intensity control input is connected via a switch-over means to the output of said first evaluation circuit means or to a topography signal.

23. A system according to claim 22 wherein the switch means is controllable by the output of the second evaluation circuit means.

24. A system according to claim 13 wherein the output of said second evaluation circuit means is connected to a control input of said scan generator means, said scan generator means having means for a chronologically limited reversing of the scan direction and a subsequent re-switching into the original scan direction, and wherein said switch-over to said lower, second scan rate of said scan generator means occurs together with said re-switching.

25. A system for determination of specific points on a specimen carrying a signal having a specific signal frequency, comprising:
    a scanning microscope having a primary beam;
    scan generator means for defining a scan rate so as to deflect the primary beam;
    means for deriving a secondary electrical signal corresponding to the scanned specific points;
    intensity modulating means for modulating said primary beam with a selectable modulation frequency;
    a first evaluation circuit means and a second evaluation circuit means connected to an output of said means for deriving said secondary electrical signal, each of the first and second evaluation circuit means providing an output signal based on a difference between the respective modulation frequency or a multiple thereof and the specific signal frequency or a multiple thereof;
    the second evaluation circuit means having a broad band-width substantially broader than a narrow band-width of the first evaluation circuit means;
    said scan generator means being switchable from a first scan rate to a second substantially slower second scan rate;
    means connected to the second evaluation circuit means output to determine when to switch the scan generator means from the first scan rate to the second scan rate; and
    means for employing the output signal of the first evaluation circuit means for evaluation with respect to the specific points carrying said specific signal frequency.

26. A system according to claim 25 wherein at least one of said first and second evaluation circuit means comprises a tunable band-pass filter and a following connected amplitude demodulator.

27. A system according to claim 25 wherein said first and second evaluation circuit means connect to respective comparators each having a respective comparison voltage supplied thereto.

28. A system according to claim 25 wherein said scan generator means supplies a position signal defining a respectively scanned point to a recording means together with the output signal of said first evaluation circuit means.

29. A system according to claim 25 wherein said scan generator means is connected to a deflection device for an electron beam of a picture tube system, and an intensity control input of the picture tube system is connected to the output of said first evaluation circuit means.

30. A system according to claim 29 wherein said intensity control input is connected via a switch-over means to the output of said first or of said second evaluation circuit means.

31. A system according to claim 29 wherein said intensity control input is connected via a switch-over means to the output of said first evaluation circuit means or to a topography signal.

32. A system according to claim 31 wherein the switch-over means is controlled by the output signal of the second evaluation circuit means.

33. A system according to claim 25 wherein the output of said second evaluation circuit means is connected to a control input of said scan generator means having means associated therewith for chronologically limited reversing of the scan direction and a subsequent re-switching into the original direction, and wherein said switch-over to said second scan rate occurs together with said re-switching.

34. A system for determination of specific points on a specimen arrying a signal having a specific signal frequency, comprising:
    a scanning microscope having a primary beam aimed at a group of points on the specimen;
    scan generator means for defining the scan rate for the primary beam;
    means for deriving a secondary electrical signal corresponding to the scanned group of points;
    evaluation circuit means connected to an output of said means for deriving said secondary electrical signal for providing an output the signal based on and representative of the specific signal frequency, and wherein said evaluation circuit means has a band-width changeable between a broad-band operating mode and a narrow-band operating mode;
        means for detecting when said output signal from said evaluation circuit means exceeds a predetermined value when said evaluation circuit means is in the broad-band operating mode, and for switching the evaluation circuit means to the narrow-band operating mode for at least a portion of a duration of the output signal exceeding the predetermined value, and for switching the scan generator means from the first to a slower second scan rate for at least said portion of the duration.

35. A system for determination of specific points on a specimen arrying a signal having a specific signal frequency, comprising:
    a scanning microscope having a primary beam aimed at a group of points on the specimen;
    scan generator means for defining a scan rate for deflection of the primary beam;
    means for deriving a secondary electrical signal corresponding to the scanned group of points;
    intensity modulating means for modulating said primary beam with a selectable modulation frequency;
    evaluation circuit means connected to an output of said means for deriving said secondary electrical signal and wherein said evaluation circuit means has a bandwidth changeable between a broad-band operating mode and a narrow-band operating mode, said evaluation circuit means providing an output signal based on and representative of a difference frequency between the modulation frequency or multiple thereof and the specific signal frequency or a multiple thereof; and
    means for detecting when said output signal from said evaluation circuit means exceeds a predetermined value with said evaluation circuit means in the broad-band operating mode, for switching the evaluation circuit means from the broad-band operating mode to the narrow-band operating mode at least for a portion of a duration of the output signal exceeding the predetermined value, and for switching the scan generator means from the first to a slower second scan rate for at least a portion of the duration.

* * * * *